United States Patent [19]

Omura et al.

[11] Patent Number: 4,957,879
[45] Date of Patent: Sep. 18, 1990

[54] METHOD OF MAKING A SEMICONDUCTOR LASER USING SUPERLATTICE DISORDERING

[75] Inventors: Etsuji Omura; Katsuhiko Goto; Shogo Takahashi; Harumi Namba; Akira Takemoto, all of Itami, Japan

[73] Assignee: Mitsubishi Denki Kabushiki Kaisha, Tokyo, Japan

[21] Appl. No.: 410,896

[22] Filed: Sep. 22, 1989

Related U.S. Application Data

[62] Division of Ser. No. 304,806, Jan. 31, 1989, Pat. No. 4,888,781.

[30] Foreign Application Priority Data

Feb. 2, 1988 [JP] Japan .................................. 63-23554

[51] Int. Cl.⁵ .................... H01L 21/20; H01L 21/203
[52] U.S. Cl. ............................ 437/129; 148/DIG. 72; 148/DIG. 95; 148/DIG. 160; 437/190; 437/133; 437/161; 437/184
[58] Field of Search ................ 148/DIG. 3, DIG. 15, 148/23, 30, 37, 35, 56, 65, 72, 95, 97, 110, 160, 169; 156/610-614; 372/45, 46; 357/16, 17, 4, 20, 55; 437/81, 105, 107, 108, 110, 126, 129, 133, 160, 161, 247, 184, 185, 934, 936, 987

[56] References Cited

U.S. PATENT DOCUMENTS

| | | | |
|---|---|---|---|
| 4,329,660 | 5/1982 | Yano et al. ............................. | 372/96 |
| 4,511,408 | 4/1985 | Holonyar, Jr. ......................... | 437/129 |
| 4,594,603 | 6/1986 | Holonyak, Jr. ......................... | 357/4 |
| 4,630,083 | 12/1986 | Yamakoshi ............................. | 372/45 |
| 4,644,553 | 2/1987 | Van Ruyjen et al. ................... | 357/4 |
| 4,654,090 | 3/1987 | Burnham et al. ....................... | 437/174 |
| 4,752,934 | 6/1988 | Fukuzawa et al. ..................... | 372/45 |
| 4,771,010 | 9/1988 | Epler et al. ............................ | 437/19 |
| 4,810,670 | 3/1989 | Furuyama et al. ..................... | 437/129 |
| 4,824,798 | 4/1989 | Burnham et al. ....................... | 437/81 |
| 4,827,483 | 5/1989 | Fukuzawa et al. ..................... | 372/45 |
| 4,830,983 | 5/1989 | Thornton ............................... | 437/161 |
| 4,843,032 | 6/1989 | Tokuda et al. ......................... | 437/129 |

FOREIGN PATENT DOCUMENTS 0074195  6/1980  Japan .................................... 372/46

OTHER PUBLICATIONS

Meehan et al., "Disorder of an AlGaAs–GaAs Superlattice by Donor Diffusion," Appl Phys. Lett. 45(5), Sep. 1, 1984, pp. 549–551.

Thornton et al., "Highly Efficient Long Lived AlGaAs Laser Fabricated by Silicon Impurity Disordering", Appl. Phys. Lett., 49(3), Jul. 21, 1986, pp. 133—134.

"AlGaAs MQW Laser with Electrodes on Epi-Layer", by Hirose et al., 18a–ZR–9 Prescripts of Autumn Meeting, 1987, Japanese Association of Applied Physics.

"AlGaAs/GaAs Lateral Current Injection MQW Laser", by Makiuchi et al. Conference on Lasers and Electro-Optics, 1987.

*Primary Examiner*—Olik Chaudhuri
*Assistant Examiner*—William Bunch
*Attorney, Agent, or Firm*—Leydig, Voit & Mayer

[57] ABSTRACT

A buried heterojunction semiconductor laser appropriate for integration with other electronic circuitry and method of producing same, in which the width of a central stripe of the active region can be reduced beyond the physical size limitations of the connecting electrode so as to allow the semiconductor laser to oscillate in a stable manner and with low threshold current. The semiconductor laser is provided with a portion of the surface of the upper cladding layer located above the disordered active layer regions electrically connected with the upper cladding layer located above the nondisordered central stripe. As a result, the central stripe electrode can be of a width larger than that of the central stripe itself.

14 Claims, 2 Drawing Sheets

METHOD OF MAKING A SEMICONDUCTOR LASER USING SUPERLATTICE DISORDERING

This is a Division, of application Ser. No. 304,806, filed Jan. 31, 1989, U.S. Pat. No. 4,888,781. su

FIELD OF THE INVENTION

The present invention relates to a semiconductor laser and a method of producing same, and more particularly to a semiconductor laser suitable for integration with electronic circuitry.

BACKGROUND OF THE INVENTION

In buried heterojunction semiconductor lasers of the multiple quantum well type, each quantum well consists of a comparatively low band gap layer, also called the well, sandwiched between a pair of barriers of higher band gap. When the plurality of quantum wells is very large, it is called a superlattice. Typically, such buried heterojunction lasers were fabricated to be discrete devices, and this allowed the p and n electrodes to be located on opposite sides of the substrate. As a result, the size of the electrodes could be relatively large and was not limited by the width of the active region. In order to facilitate integration of these devices with other electronic circuitry, some prior art heterojunction lasers are designed with both electrodes on the same side of the substrate. However, this configuration implies that the electrode which overlies the laser active region, and hereinafter called the central stripe electrode, be narrower than the active region and accurately positioned thereon.

FIG. 2 shows a cross-section of a prior art heterojunction laser appropriate for integration. In FIG. 2, a p-type AlGaAs cladding layer 202, multiquantum-well (MQW) active layer 203, n-type AlGaAs cladding layer 204 and n-type GaAs contact layer 205 are successively produced on a semi-insulative GaAs substrate 201. Zn is then selectively diffused to create p-type diffused regions 208 such that an n-type region, in a stripe configuration, remains. In addition, in the area where the p-n junction is exposed to the surface, the n-type GaAs contact layer is selectively etched so that p side and n side electrodes 206 and 207 can be produced on the surface of the p-type and n-type regions, respectively.

According to this production method, the MQW active layer 203 is disordered at the Zn diffused areas 208 and becomes an AlGaAs layer of average composition, thereby creating a buried heterojunction laser structure. The operation of this prior art semiconductor laser is described in the following paragraph.

In such a semiconductor laser, two kinds of p-n junctions are provided. The first kind is created at the periphery of active region 209 (where the MQW is not disordered). The second kind of junction is created between the n-type AlGaAs cladding layer 204 located above active region 209 and each diffused region 208. Because the first kind of p-n junction has a diffusion voltage lower than that of the second kind, when a voltage is applied between the p side and n side electrodes, a current flows through the p-n junction located at the periphery of active region 209. As a result, carriers are injected in the active region. Since active region 209 is adjacent on its four sides to AlGaAs having a low refractive index, it becomes a light waveguide, and if the width of active region 209 can be made narrow enough, the laser will oscillate at a stable single mode with a low threshold current. Finally, because this prior art semiconductor laser has both p and n side electrodes located on the same main surface with little step difference, it is therefore in a form appropriate for integration.

In prior art buried heterojunction lasers which are appropriate for integration and which utilize the disordering of a superlattice, the n side electrode is confined to the width of the active region. Referring to FIG. 2, it will be appreciated that if the n side electrode 207 were wider than the central stripe 209, it would overlie part of the diffused region 208 and create an undesirable low resistance conductive path between the electrodes consisting of p-type material in the region 208. Consequently, the width of the active region is directly related to that of the electrode. Because it is preferable to have the width of the active region smaller than 2 $\mu$m for single transverse mode oscillation, this implies that the n side electrode must be narrower than 2 $\mu$m. Common photolithographic production methods do not, however, readily allow the fabrication of electrodes of a width under 2 $\mu$m. As a result, the oscillation mode of semiconductor lasers of the prior art is not very stable and the threshold current cannot be reduced. Even if it were possible to produce, by an advanced technology, an electrode of a width around 1 $\mu$m, positioning such a narrow electrode would be quite difficult. Moreover, the electrode resistance would be too large to conduct the current required for continuous laser oscillation.

SUMMARY OF THE INVENTION

In view of the foregoing, it is a general aim of the present invention to provide a semiconductor laser suitable for integration with other electronic circuitry and of improved oscillation stability and lower threshold current.

Accordingly, it is an object of the present invention to provide a semiconductor laser in which the electrodes are located on the same side of the substrate and where the minimum width of the active layer is not limited by the fabrication constraints of the central stripe electrode.

An additional object of the present invention is to provide a method of producing a semiconductor laser having such properties.

Other objects and advantages of the present invention will become apparent from the detailed description given hereinafter; it should be understood, however, that the detailed description and specific embodiments are given by way of illustration only, since, from this detailed description, various changes and modifications within the spirit and scope of the invention will become apparent to those skilled in the art.

It is a feature of the present invention that in a buried heterojunction laser utilizing a disordered multiquantum-well, a portion of the surface of the upper cladding layer located above disordered active layer regions is electrically connected with the upper cladding layer located above the nondisordered active layer area. As a result, the electrode located above the nondisordered active layer is no longer confined to the nondisordered active layer area but can now extend over a portion of the surface of the upper cladding layer located above disordered active layer areas.

According to a method of producing a semiconductor laser of the present invention, a lower cladding layer, quantum well active layer, and upper cladding layer of a given conductivity type are successively grown on a semiconductor substrate to form a heterostructure. A portion of the active layer is then disordered by conducting, from above the upper cladding layer, a solid phase diffusion of impurities of a conductivity type opposite the conductivity type of the upper cladding layer. This diffusion process also inverts the conductivity type of diffused regions of the upper cladding layer. Next, the conductivity of a portion only of the diffused regions of the surface of the upper cladding layer is re-inverted to the original conductivity type of the upper cladding layer. Finally, p and n side electrodes are produced on the corresponding conductivity type regions of the upper cladding layer, thereby completing the fabrication process of a buried heterojunction semiconductor laser of the present invention.

According to a preferred method, the region of re-inverted conductivity type is formed self-aligningly with the nondisordered active region. Following solid phase diffusion, part of the diffusion source is removed, and a part which had defined one of the diffused regions is left in place. The part which is left in place is used as a mask for an ion implantation operation which re-inverts the conductivity of the unmasked part of the diffused regions.

It is a feature of the invention that the upper cladding layer re-inverted region becomes electrically connected with the upper cladding layer located above the nondisordered active layer area, and the width of the active layer can be easily reduced without being limited by minimum size considerations of the central stripe electrode.

A semiconductor laser having such a narrow active region can, however, be easily produced because of the self-aligning fabrication feature of the central stripe electrode. In addition, a semiconductor laser in which the active region is small will oscillate in a more stable manner and require fewer carriers to be injected in the active region area in order to maintain oscillation. As a result, the threshold current will be reduced.

DETAILED DESCRIPTION OF THE PREFERRED EMBODIMENTS

Figure 1:
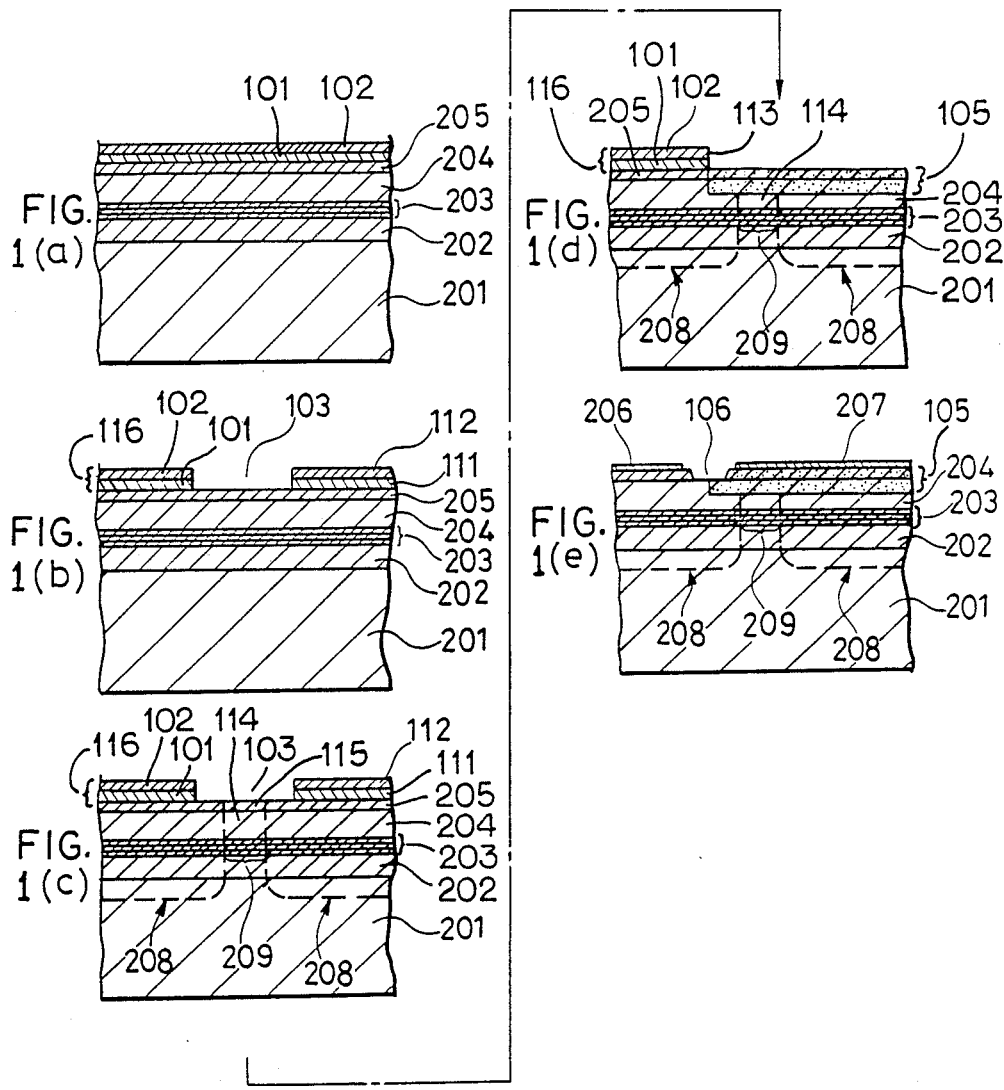
FIGS. 1(a)-1(e) are schematic diagrams showing a method of producing a semiconductor laser as an embodiment of the present invention.

Turning now to the drawings, FIGS. 1(a)-(e) illustrate the major steps in producing a semiconductor laser according to the present invention. In the illustrated embodiment, a p-type AlGaAs lower cladding layer 202, a multiquantum-well active layer 203, an n-type AlGaAs upper cladding layer 204, and an n-type GaAs contact layer 205 are successively deposited on a semi-insulative GaAs substrate 201 by chemical vapor deposition epitaxy or by molecular beam epitaxy. The term upper cladding layer is used herein in a broad sense and should be understood to include both the AlGaAs layer 204 and, when present, the associated GaAs layer 205.

To disorder the multiquantum-well, a ZnO doped film 101 is used as a diffusion source. The diffusion film 101 and a SiO$_2$ film 102, the latter being used to cap ZnO film 101, are grown on the main surface of n-type GaAs contact layer 205 by chemical vapor deposition epitaxy or by a sputtering method. The preferred thickness of each film 101 and 102 is about 500 Å. Although the SiO$_2$ film 102 is not absolutely required, by capping the diffusion source 101 with SiO$_2$ film 102 diffusion of Zn into the ambient is prevented. As a result, diffused regions of higher zinc concentration are obtained.

In the next step, a window 103 in a shape of a stripe approximately 10 μm wide, is removed from the SiO$_2$ and ZnO films, 102 and 101, respectively, using a process such as photolithography and chemical etching. This window 103, which is bordered on its right side by regions 111, 112 of the ZnO diffusion film and SiO$_2$ capping film, respectively, may be coated over by a dielectric film such as Si$_3$N$_4$ (not shown) in order to protect the surface of n-type GaAs contact layer 205 as required.

When this wafer, having a window is annealed at 700° C. for several hours in a nitrogen ambient or in an ambient consisting of a mixture of nitrogen and hydrogen, a so-called solid phase diffusion of Zn from ZnO film 101, 111 occurs thereby producing p diffused regions 208. The portions of the upper cladding layer 204 including contact layer 205 within the diffused regions 208 are inverted in conductivity, in the illustrated embodiment from n to p type. In the active layer 203, which consists of a multiquantum-well, a smearing of the boundaries of the thin well and barrier GaAs and AlGaAs layers occurs during the solid phase diffusion process, changing the active layer into an AlGaAs layer of averaged composition. This process is called the disordering of the multiquantum-well.

In the region beneath window 103 which is not diffused with p impurities, the active layer remains a non-disordered multiquantum-well creating a central stripe 209 (FIG. 1(c)) which functions as an active region. It is seen that portion 114 of the upper cladding layer and a corresponding portion 115 of the contact layer, which portions overlie the central stripe 209, retain their original conductivity type. Even when window 103 is 10 μm wide, and because diffusion occurs in all directions including into the stripe, diffused regions 208 are expanded in a direction perpendicular to the direction of growth of the layers on substrate 201. As a result, by controlling the characteristics of the diffusion process such as diffusion source impurity concentration and annealing conditions, it becomes possible to easily reduce the width of active layer 209 to a dimension under 2 μm which is recommended for fundamental mode oscillation.

After this solid phase diffusion, portion 111 of ZnO film 101 which was used as a diffusion source and portion 112 of SiO$_2$ film 102 are removed so as to widen window 103. In the illustrated embodiment, film layers 111 and 112 are removed, while the portions of film layers 101, 102 on the left-hand side of window 103 are left in place. It is important to note that the edge 113 of left in place portions of films 101, 102, by virtue of the fact that it had defined (in the diffusion process) the extent of the diffused region 208, has a known positional relationship to the central stripe 209.

In accordance with the invention, means are provided for re-inverting the conductivity type of a portion only of the surface of the inverted upper cladding layer to its original conductivity type. The re-inverted region is positioned such that it is in electrical contact with the portion 114, 115 of the upper cladding layer located above the central stripe 209. Advantageously, a mask 116 comprising left in place portions of films 101, 102 formed as described above, is used in re-inverting a portion of the surface of the upper cladding layer in a fashion which is self-aligning with the central stripe 209.

More particularly, in the illustrated embodiment, after removal of diffusion source portions 111, 112 as described above, Si ions are implanted into the upper cladding layer 204 and contact layer 205 using left in place portions of films 101, 102 as a mask 116. As a result, this ion implantation re-inverts the conductivity of a portion of the surface of diffused regions 208 to n-type (in the illustrated embodiment, region 105 extending rightward from edge 113), while leaving the upper cladding layer region on the left-hand side of edge 113 of p-type conductivity. It produces, self-aligningly with active region 209, an n-type region 105, in electrical contact with the upper cladding layer portion 114, 115 located above nondisordered active region 209 as shown in FIG. 1(d).

Finally, after removing mask 116 in the area where the diffused contact layer 205 meets the re-inverted region 105, the contact layer is etched to form a groove in order to separate p- and n-type contact layer regions. To complete the fabrication process, p and n side electrodes 206 and 207 are then produced on the corresponding p-type and n-type regions of the GaAs contact layer.

Figure 2:
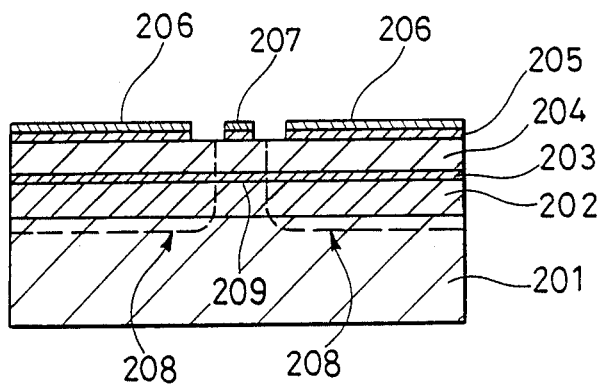
FIG. 2 is a cross-section exemplifying a prior art buried heterojunction semiconductor laser using a disordered superlattice.

Because n-type region 105 overlies not only the central stripe 209 but also at least a portion of one of the diffused regions 208, and recalling that it is in electrical contact with the upper cladding layer portion 114, 115 which overlies the central stripe, it is seen that the n side electrode is no longer confined to the width of the central stripe. As can be appreciated upon reference to FIG. 1(e), the n-side can be of a size larger than the central stripe 209, and can thus be made of a size which facilitates production, without running the risk of shorting the active region through the p-type disordered region as encountered in the FIG. 2 prior art semiconductor laser.

Turning now to the operation of the semiconductor laser of the present invention, when a voltage is applied between the p side and n side electrodes with the p side electrode positive with respect to the n side, carriers are injected into the active region to cause laser oscillation under the same principle as that of prior art semiconductor lasers. The conductive path includes the p-side electrode 206, the p-type diffused regions of the contact layer 205, upper cladding layer 204 and p-type lower cladding layer 202 to the periphery of the active region 209. The p-n junction is formed between those p-type layers and n-type region 114 of the upper cladding layer. The conductive path is completed through the enlarged re-inverted region 105 of the upper cladding and contact layers 204, 205 to the enlarged n-side electrode 207. As in the FIG. 2 embodiment, the diffusion voltage of the p-n junction at the periphery of the active region 209 is lower than that of the p-n junction between the opposite conductivity type regions in the upper cladding layer. As a result, current will flow through the former and carriers will be injected into the active region. In the described embodiment of the invention, because the width of the active region can be made very narrow without being restricted by minimum width requirements for the n side electrode, fundamental transverse mode oscillation easily occurs and the threshold current is reduced to about 1 mA. In addition, the fact that the p side and n side electrodes are located on the same main surface and at about the same level allows integration of this semiconductor laser with other electronic circuitry.

In the above-illustrated embodiment, the active layer is a multiquantum-well although it may instead consist of a single quantum well or a superlattice. Furthermore, the proportions in Al composition of the p-type and n-type AlGaAs cladding layers, between which the active layer is sandwiched, do not necessarily have to be constant within each cladding layer but may vary gradually, along the direction of growth of the layers, as in a graded type laser.

In the illustrated embodiment, a GaAs series laser is described, but the present invention is applicable as well to an InP series laser or to a series laser of a different material.

In the illustrated embodiment, Zn diffusion from a zinc oxide doped film is used as an example of solid phase diffusion. However, solid phase diffusion from a silicon film of n-type impurities can be used in a semiconductor laser in which the conductivity type of each layer is the reverse of that shown in the illustrated embodiment.

The AlGaAs lower cladding layer may be of n-type conductivity instead of p-type as in the illustrated embodiment. This lower cladding layer may also be of a semi-insulative type. In this case, the injection of carriers occurs only from the upper cladding layer as carriers cannot be injected from the semiinsulative layer. However, effects almost similar to those obtained when the lower cladding layer is not of the semi-insulative type should result.

In the above-illustrated embodiment, a GaAs contact layer 205 with separation groove 106 is provided on the upper cladding layer. However, this GaAs contact layer 205, although preferred, is not mandatory. When no contact layer is provided, the value of the contact resistance between each electrode and its respective conductivity region is higher but no separation groove is necessary.

The foregoing description of the operation of a semiconductor laser according to the present invention shows that, in a buried heterojunction laser utilizing the disordering of a multiquantum-well, a portion of the surface of the upper cladding layer located above the disordered active layer regions is electrically connected with the upper cladding layer located above the nondisordered central stripe. As a result, the central stripe width can be reduced independently of that of the corresponding electrode, which can, therefore, be of a large size. Additionally, the oscillation of the semiconductor laser is rendered more stable and the required threshold current is reduced. Moreover, because both p and n side electrodes are located on the upper surface of the chip, this configuration is appropriate for integration with other electronic circuitry.

According to a method of producing a semiconductor laser of the present invention, a portion of an active layer is disordered by conducting, from above an upper cladding layer, solid phase diffusion of first type conductivity impurities. A portion of the surface of the upper cladding layer, located above the disordered active layer regions and which was inverted to first type conductivity during the above-described solid phase diffusion, is re-inverted to second type conductivity and is electrically connected with the upper cladding layer located above the nondisordered central stripe. This re-inversion process is restricted to certain areas of the upper cladding layer by using as a mask the one part of the diffusion source which had defined one of the diffused regions and which was left in place after the diffusion step so as to form a region of inverted conductivity type self-aligningly with the nondisordered active region.

Accordingly, this production method provides a semiconductor laser in which both p and n side electrodes are located on the upper surface of the chip and where the width of the active region is reduced without being any longer limited by minimum size considerations of the connecting electrode. The semiconductor laser obtained through this process can further be produced easily self-aligningly and oscillates in a stable manner with low threshold current. It is also in a configuration appropriate for integration with other electronic circuitry such as FET devices which could be used to modulate laser current and, therefore, the light being emitted by the laser. Moreover, the electrode which is connected to the conductivity area located above the nondisordered active layer, can be of a significant size as it no longer has to match the width of the semiconductor laser active region.

What is claimed is:

1. A method of producing a buried heterojunction semiconductor laser, which comprises the steps of:
    (a) successively depositing a lower cladding layer, a quantum well active layer, and an upper cladding layer of a given conductivity type on a semiconductor substrate to form a heterostructure;
    (b) disordering regions of said active layer to define a nondisordered central stripe, by conducting from above said upper cladding layer, solid phase diffusion of impurities of a conductivity type opposite that of the upper cladding layer, the solid phase diffusion also serving to invert the conductivity type of a portion of the upper cladding layer;
    (c) re-inverting the conductivity type, previously obtained during said solid phase diffusion process, of a portion of the surface of the inverted upper cladding layer, to the original conductivity type of the upper cladding layer to form a re-inverted region in electrical contact with the portion of the upper cladding layer located above said central stripe;
    (d) forming p and n electrodes on top of corresponding conductivity type areas of the upper cladding layer to establish a conductive path through said areas to the central stripe.

2. A method of producing a semiconductor laser as defined in claim 1, wherein the step of depositing the upper cladding layer includes depositing a contact layer on the surface of said upper cladding layer for improving the electrical contact between the upper cladding layer and the electrodes.

3. A method of producing a semiconductor laser as defined in claim 2, which further includes the step of forming a groove by etching a portion of the contact layer to separate the first and second conductivity type areas of said contact layer.

4. A method of producing a semiconductor laser as defined in claim 1, wherein the disordering step includes depositing a diffusion layer on said upper cladding layer, removing part of said diffusion layer to form a diffusion source which selectively defines the diffused regions, and diffusing impurities into the heterostructure by annealing said heterostructure.

5. A method of producing a semiconductor laser as defined in claim 4, wherein the re-inverting step includes removing part of the diffusion source, leaving in place a further part of the diffusion source which had defined one of the diffused regions, performing ion implantation into the upper cladding layer using said further part of the diffusion source as a mask, to form the re-inverted region self-aligningly with the nondisordered central stripe.

6. A method of producing a semiconductor laser as defined in claim 5, which further includes the step of forming a groove by etching a portion of the contact layer to separate the first and second conductivity type areas of said contact layer.

7. A method of producing a semiconductor laser as defined in claim 4, wherein said upper cladding layer is of n-type conductivity and wherein a ZnO film is employed as the solid phase diffusion source.

8. A method of producing a semiconductor laser as defined in claim 7, wherein a $SiO_2$ film is used to cap the ZnO diffusion film.

9. A method of producing a semiconductor laser as defined in claim 7, wherein the step of re-inverting the conductivity type of a region of said upper cladding layer includes implanting Si ions into said n-type upper cladding layer.

10. A method of producing a semiconductor laser as defined in claim 1, wherein the step of forming electrodes includes forming on the upper cladding layer two electrodes both of a size larger than the width of the central stripe.

11. A method of producing a buried heterojunction semiconductor laser, which comprises the steps of:
    (a) successively depositing a lower cladding layer, a quantum well active layer, an upper cladding layer of a given conductivity type, and a diffusion layer on a semiconductor substrate to form a heterostructure;
    (b) removing a window in a shape of a stripe from a portion of said diffusion layer to form two diffusion sources separated by said window;
    (c) annealing said heterostructure to conduct from said diffusion layer, solid phase diffusion of impurities of a conductivity type opposite that of the upper cladding layer to define disordered regions in said active layer and a nondisordered central stripe, the solid phase diffusion also serving to invert the conductivity type of a portion of the upper cladding layer;
    (d) forming a mask to produce masked and unmasked surface portions of the upper cladding layer including masked and unmasked portions of inverted conductivity type;
    (e) performing ion implantation in said unmasked portion of the upper cladding layer to re-invert the conductivity type of the unmasked surface of said upper cladding layer;
    (f) forming electrodes on top of the first and second conductivity type areas of the upper cladding layer to establish a conductive path through said areas to the active layer.

12. A method of producing a semiconductor laser as defined in claim 11, wherein the step of forming a mask includes removing a portion of the diffusion layer and leaving in place a part of said diffusion layer which had defined one of the diffused regions in order to unmask a part only of the inverted conductivity type upper cladding layer.

13. A method of producing a semiconductor laser as defined in claim 11, which further includes the step of forming a groove by etching a portion of the contact layer to separate the first and second conductivity type areas of said contact layer.

14. A method of producing a semiconductor laser as defined in claim 11, wherein the re-inverting step includes removing one of the two diffusion sources, leaving in place the other diffusion source which had defined one of the two diffused regions, performing ion implantation into the upper cladding layer using said one remaining diffusion source as a mask, to form the re-inverted region self-aligningly with the nondisordered central stripe.

* * * * *